(12) United States Patent
Nishiguchi

(10) Patent No.: US 9,337,283 B2
(45) Date of Patent: May 10, 2016

(54) SEMICONDUCTOR DEVICE WITH FIELD PLATE

(71) Applicant: KABUSHIKI KAISHA TOSHIBA, Tokyo (JP)

(72) Inventor: Toshifumi Nishiguchi, Ishikawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 11 days.

(21) Appl. No.: 14/016,181

(22) Filed: Sep. 2, 2013

(65) Prior Publication Data
US 2014/0284773 A1    Sep. 25, 2014

(30) Foreign Application Priority Data

Mar. 22, 2013    (JP) .................................. 2013-061059

(51) Int. Cl.
| | | |
|---|---|---|
| H01L 29/78 | (2006.01) | |
| H01L 29/40 | (2006.01) | |
| H01L 29/41 | (2006.01) | |
| H01L 21/28 | (2006.01) | |
| H01L 29/423 | (2006.01) | |
| H01L 29/66 | (2006.01) | |

(Continued)

(52) U.S. Cl.
CPC .............. *H01L 29/407* (2013.01); *H01L 21/28* (2013.01); *H01L 29/401* (2013.01); *H01L 29/4236* (2013.01); *H01L 29/42368* (2013.01); *H01L 29/42376* (2013.01); *H01L 29/66734* (2013.01); *H01L 29/7813* (2013.01); *H01L 29/7827* (2013.01); *H01L 29/513* (2013.01)

(58) Field of Classification Search
CPC ............ H01L 29/407; H01L 29/42376; H01L 29/7813; H01L 29/66734; H01L 29/4233; H01L 29/66727; H01L 29/7827
See application file for complete search history.

(56) References Cited

U.S. PATENT DOCUMENTS

| | | | |
|---|---|---|---|
| 7,679,136 B2 | 3/2010 | Kachi et al. | |
| 7,781,341 B2 | 8/2010 | Nakazawa | |

(Continued)

FOREIGN PATENT DOCUMENTS

| | | |
|---|---|---|
| JP | 2010-129973 | 0/2010 |
| JP | 2012-204395 A | 10/2012 |

OTHER PUBLICATIONS

Office Action dispatched Apr. 8, 2015, filed in corresponding Japanese Patent Application No. 2013-061059, with English translation.

*Primary Examiner* — Victor A Mandala
*Assistant Examiner* — Regan J Rundio
(74) *Attorney, Agent, or Firm* — Patterson & Sheridan, LLP

(57) ABSTRACT

A semiconductor device includes a first semiconductor layer, a second semiconductor layer of a second conductivity type formed on the first semiconductor layer, a first electrode which extends in a first direction and is surrounded by the first semiconductor layer except at one end thereof, and a first insulation film which is formed between the first semiconductor layer and the first electrode. A film thickness of the first insulation film between the other end of the first electrode in a second direction opposite to the first direction and the first semiconductor layer includes a thickness that is greater than a thickness of the first insulation film along a side surface of the first electrode. The semiconductor device also includes a second electrode which faces the second semiconductor layer, and a second insulation film which is formed between the second electrode and the second semiconductor layer.

10 Claims, 17 Drawing Sheets

(51) Int. Cl.
*H01L 21/336* (2006.01)
*H01L 29/51* (2006.01)

(56) References Cited

U.S. PATENT DOCUMENTS

| | | | |
|---|---|---|---|
| 7,998,808 B2 * | 8/2011 | Viswanathan et al. | 438/243 |
| 8,431,989 B2 * | 4/2013 | Bhalla | H01L 29/407 |
| | | | 257/330 |
| 8,487,370 B2 * | 7/2013 | Blank et al. | 257/330 |
| 8,975,662 B2 * | 3/2015 | Hutzler et al. | 257/139 |
| 9,202,882 B2 * | 12/2015 | Henson | H01L 29/407 |
| 2003/0030092 A1 | 2/2003 | Darwish et al. | |
| 2006/0141739 A1 | 6/2006 | Poelzl | |
| 2006/0273386 A1 | 12/2006 | Yilmaz et al. | |
| 2007/0138547 A1 * | 6/2007 | Nakamura | 257/331 |
| 2008/0230833 A1 * | 9/2008 | Zundel | H01L 29/0878 |
| | | | 257/330 |
| 2009/0152624 A1 * | 6/2009 | Hiller et al. | 257/330 |
| 2010/0308400 A1 * | 12/2010 | Darwish et al. | 257/330 |
| 2011/0215399 A1 | 9/2011 | Matsuura et al. | |
| 2012/0168859 A1 * | 7/2012 | Jin et al. | 257/330 |
| 2014/0008722 A1 * | 1/2014 | Mariani et al. | 257/334 |
| 2015/0076592 A1 * | 3/2015 | Asahara | 257/330 |
| 2015/0318361 A1 * | 11/2015 | Siemieniec | H01L 29/0623 |
| | | | 438/270 |

* cited by examiner

SEMICONDUCTOR DEVICE WITH FIELD PLATE

CROSS-REFERENCE TO RELATED APPLICATION

This application is based upon and claims the benefit of priority from Japanese Patent Application No. 2013-061059; filed Mar. 22, 2013, the entire contents of which are incorporated herein by reference.

FIELD

Embodiments described herein relate generally to a semiconductor device.

BACKGROUND

A semiconductor device such as a power Metal Oxide Semiconductor Field Effect Transistor (MOSFET) is required to possess high dielectric breakdown strength and low ON resistance. These devices typically include a gate structure having a field plate electrode disposed within a gate trench that is used to realize the high dielectric breakdown strength and low ON resistance. However, acquiring both high breakdown strength and low ON resistance are demands which generally contradict each other. To increase the breakdown strength of the semiconductor device, it is necessary to increase the thickness of a field plate oxide film which insulates a semiconductor layer and the field plate electrode from each other. As a result, during the steps of manufacturing of the semiconductor device, warping of the wafer in excess of an allowable range may occur.

DETAILED DESCRIPTION

Figure 1:
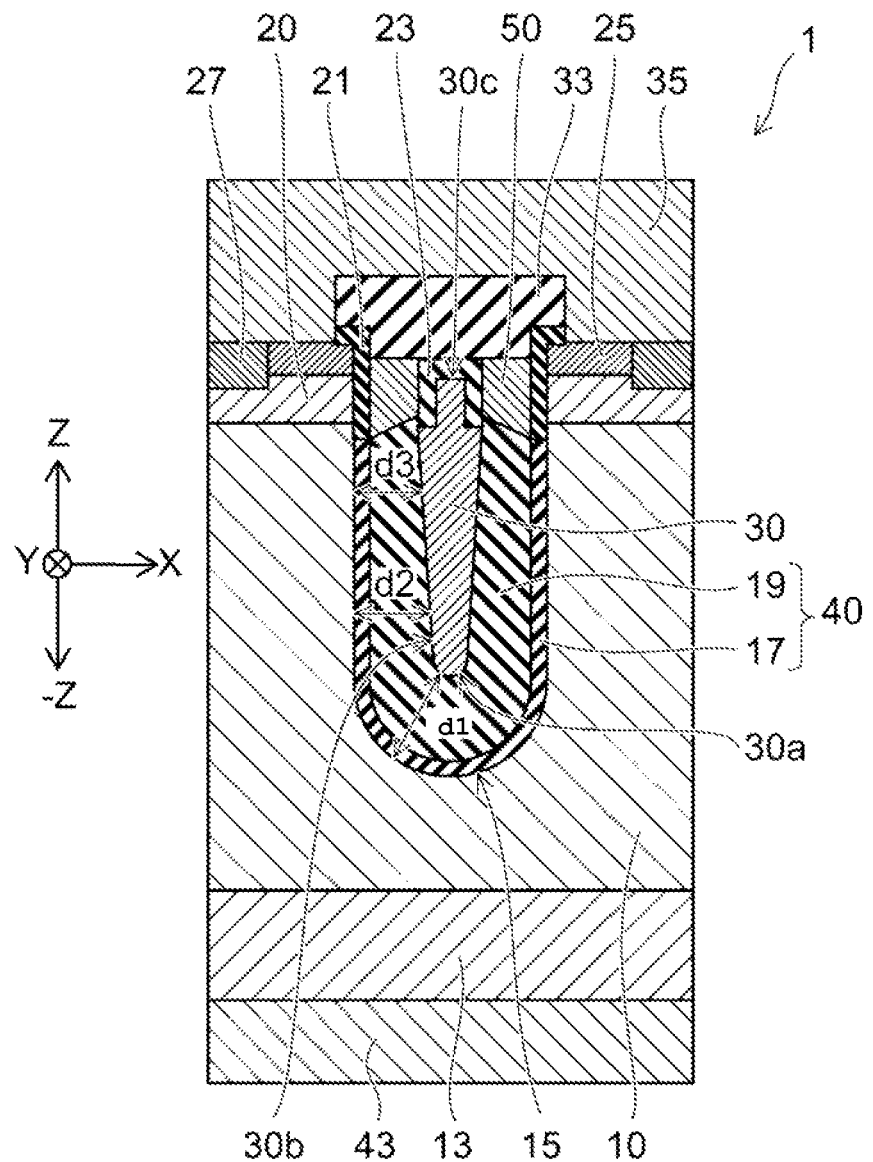
FIG. 1 is a schematic cross-sectional view showing a semiconductor device according to a first embodiment.

An embodiment provides a semiconductor device which possesses high dielectric breakdown strength and low ON resistance manufactured according to embodiments described herein that suppresses the warping of a wafer.

In general, according to one embodiment, there is provided a semiconductor device which includes: a first semiconductor layer, a second semiconductor layer of a second conductivity type formed on the first semiconductor layer, a first electrode which extends in a first direction and is surrounded by the first semiconductor layer except at one end thereof, and a first insulation film which is formed between the first semiconductor layer and the first electrode. The first insulation film includes a first layer in contact with the first semiconductor layer and a second layer formed between the first electrode and the first layer. A film thickness of the first insulation film between the other end of the first electrode in a second direction opposite to the first direction and the first semiconductor layer includes a thickness that is greater than a thickness of the first insulation film along a side surface of the first electrode. The semiconductor device also includes a second electrode which faces the second semiconductor layer, and a second insulation film which is formed between the second electrode and the second semiconductor layer.

Hereinafter, embodiments are explained in conjunction with drawings. In the drawings, identical parts are given same symbols and detailed explanation of such parts is omitted as required for brevity, while the explanation is made with respect to parts which differ between embodiments. The embodiments are schematically or conceptually shown in the drawing, and the relationship between a thickness and a width of each part, a ratio in size between parts and the like are not always equal to those of an actual semiconductor device. Further, even if the same part is expressed in the drawings, the size and scale in one drawing may differ from the size and scale in other drawings. In the explanation made hereinafter, a first conductivity type is an n-type and a second conductivity type is a p-type. However, the conductivity types are not limited as such, and there may be a case where the first conductivity type is a p-type and the second conductivity type is an n-type.

(First Embodiment)

FIG. 1 is a schematic cross-sectional view showing a semiconductor device 1 according to the first embodiment. Hereinafter, the structure of the semiconductor device 1 is explained by reference to XYZ orthogonal coordinates shown in the drawings.

The semiconductor device 1 includes, for example, an n-type drift layer 10 (first semiconductor layer) and a p-type base layer 20 (second semiconductor layer). The p-type base layer 20 is formed on the n-type drift layer 10 in the Z direction.

An n-type source layer 25 (third semiconductor layer) and a p-type contact layer 27 are formed on the p-type base layer 20 in such a manner that these layers 25, 27 are arranged laterally and/or parallel to each other. On the other side, an n-type drain layer 13 (fourth semiconductor layer) is formed on the n-type drift layer 10 in the −Z direction.

The charge carrier density in the n-type drain layer 13 is higher than the charge carrier density in the n-type drift layer 10. The charge carrier density in the p-type contact layer 27 is higher than the charge carrier density in the p-type base layer 20.

The n-type drain layer 13 maybe formed of, for example, an epitaxial layer formed on a semiconductor substrate or may be formed directly on a semiconductor substrate.

In the explanation of the semiconductor device 1 made hereinafter, a "conductivity type" is omitted. The term "wafer" used in this specification includes a semiconductor substrate, a semiconductor substrate on which a semiconductor layer is formed, and a semiconductor substrate on which insulation films, an electrode, and the like, are formed.

The semiconductor device 1 includes a trench 15 having a depth at which the trench 15 extends into the drift layer 10 from the source layer 25. A field plate electrode 30 (first electrode) which extends in the direction toward the base layer 20 from the drift layer 10 is arranged within the trench 15. The field plate electrode 30 is surrounded by the drift layer 10 except for a portion thereof directed in a first direction of the trench 15 (Z direction). A field plate insulation film (first insulation film) is formed along the Z direction between the field plate electrode 30 and the drift layer 10. As shown, the proximal end of the field plate electrode 30 terminates in a radius. In other words, the proximal end of the field plate electrode 30 has a curvature defined by a certain radius.

The field plate insulation film 40 includes: a first film 17 which is in contact with the drift layer 10; and a second film 19 which is formed between the first film 17 and the field plate electrode 30. For example, the first film 17 is formed of a silicon oxide film or a silicon nitride film, and the second film 19 is formed of a silicon oxide film which contains at least one of phosphorus (P) and boron (B), for example.

With respect to a film thickness of the field plate insulation film 40, the film thickness d1 between a proximal end 30a of the field plate electrode 30 and the drift layer 10 in the −Z direction is greater than the film thickness (d2 and/or d3) between a side surface 30b of the field plate electrode extending in the Z direction and the drift layer 10 (d1>d2, d3).

In the inside of the trench 15, gate electrodes 50 (second electrodes) are formed on an end of the field plate insulation film 40 in the Z direction. The gate electrodes 50 face the base layer 20. A gate insulation film 21 (second insulation film) is formed between the gate electrode 50 and the base layer 20. A thickness of the gate insulation film 21 is less than a thickness of the field plate insulation film 40.

In this embodiment, a distal end 30c of the field plate electrode 30 in the Z direction extends to an area between two gate electrodes 50 from the side of the drift layer 10. That is, each gate electrode 50 is positioned between the field plate electrode 30 and the base layer 20. An insulation film 23 (third insulation film) is formed between the field plate electrode 30 and the gate electrodes 50.

An interlayer insulation film 33 is formed over the gate electrodes 50 and the field plate electrode 30. Further, a source electrode 35 is formed on the interlayer insulation film 33, the source layers 25 and the contact layers 27. The source electrode 35 is electrically connected to the source layers 25, and is electrically connected to the base layer 20 via the contact layers 27. On the other side, a drain electrode 43 is formed on a rear surface side of the drain layer 13 in the −Z direction of the drift layer 10.

In the semiconductor device 1, a drain current which flows between the drain electrode 43 and the source electrode 35 is controlled by the gate electrodes 50. The field plate electrode 30 is connected to the source electrode 35 through a portion thereof not shown in the drawing. The field plate electrode 30 enhances a dielectric breakdown strength between the source and the electrode by controlling an electric field in the drift layer 10 which is positioned in the −Z direction with respect to the gate electrodes 50.

Next, a method of manufacturing the semiconductor device according to this embodiment is explained in conjunction with FIG. 2A to FIG. 8B. FIG. 2A to FIG. 8B are schematic cross-sectional views showing steps of manufacturing the semiconductor device according to this embodiment.

Figure 2A:
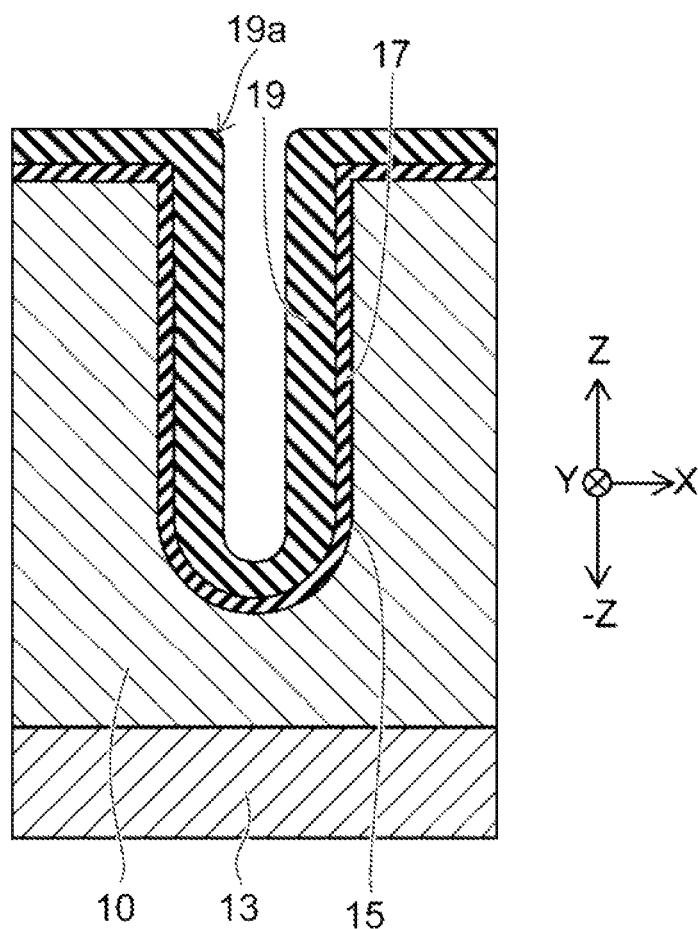
FIGS. 2A to 8B are schematic cross-sectional views showing the incremental layout of the device during the steps of manufacturing the semiconductor device according to the first embodiment.

As shown in FIG. 2A, the first film 17 and the second film 19 are formed. The second film 19 is formed on the first film 17 which covers an inner surface of the trench 15 formed on the drift layer 10.

The drift layer 10 is formed on the drain layer 13. The drift layer 10 is formed of a silicon layer doped with an n-type impurity, for example, and the density of impurity is $1 \times 10^{15}$ to $5 \times 10^{16} cm^{-3}$. The drain layer 13 contains an n-type impurity at a density of $1 \times 10^{17}$ to $5 \times 10^{17} cm^{-3}$, for example. The drain layer 13 is formed of a silicon substrate or an epitaxial layer formed on the silicon substrate, for example.

The first film 17 is formed of a silicon oxide film which is formed by thermally oxidizing the drift layer 10, for example. The first film 17 may be formed of a silicon oxide film or a silicon nitride film which can be deposited using a CVD (Chemical Vapor Deposition) method.

The second film 19 is formed of a silicon oxide film which contains at least one of phosphorus (P) and boron (B), for example. The second film 19 is formed on the first film 17 using a CVD method, for example. By forming the second film 19 on the first film 17 which is not doped with an impurity, homogeneity of silicon oxide film containing phosphorus and boron (Boron Phosphorus Silicon Glass: BPSG) can be enhanced. That is, it is sufficient for the first film 17 to have a film thickness which allows the second film 19 to ensure homogeneity. A dielectric strength of the field plate insulation film 40 is ensured by forming the second film 19 having a large thickness.

For example, a silicon thermal oxide film having a film thickness of 100 to 200 nm is formed as the first film 17, and a BPSG film having a film thickness of 500 to 600 nm is formed as the second film 19.

Next, the first film 17 and the second film 19 are reformed. To be more specific, heat treatment (annealing) is applied to a wafer on which the first film 17 and the second film 19 are formed at a temperature of 800 to 900° C. for 30 to 50 minutes, for example. Due to such heat treatment, the BPSG film is made to reflow and is reformed.

Figure 2B:
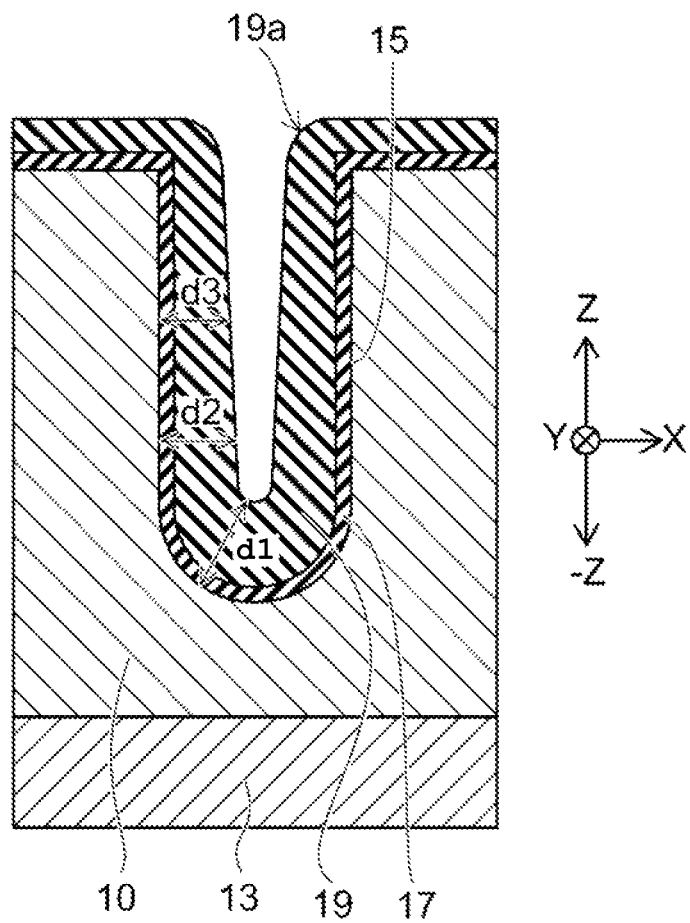

As a result, as shown in FIG. 2B, the BPSG film is deformed such that a thickness of the second film 19 formed on a bottom portion of the trench 15 is increased while the thickness of the second film 19 formed on the side surfaces of the trench 15 is decreased. Accordingly, a total film thickness d1 of the first film 17 and the second film 19 at the bottom portion of the trench 15 becomes greater than a film thickness d2 and a film thickness d3 at the side surface of the trench 15. Further, the total film thickness of the first film 17 and the second film 19 is gradually decreased as the films extend in the Z direction (d3<d2).

Figure 3A:
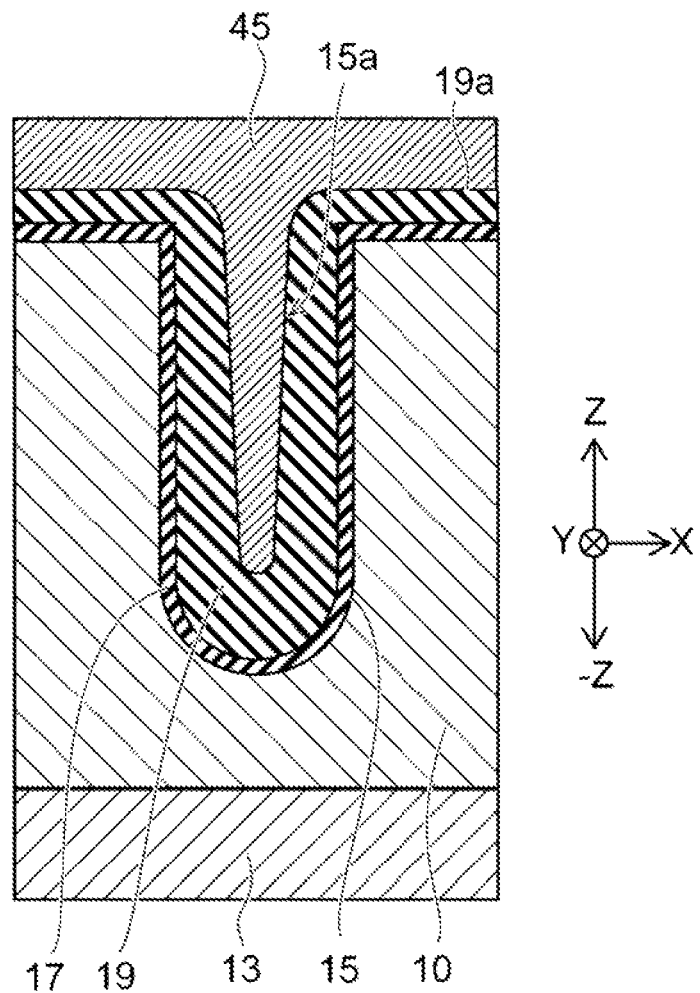

Next, as shown in FIG. 3A, a conductive layer 45 is formed on the second film 19 so that a space 15a formed in the inside of the trench 15 is buried with the conductive layer 45. The conductive layer 45 is made of polycrystalline silicon (polysilicon) having good conductive properties, for example, and can be formed by a CVD method.

Figure 3B:
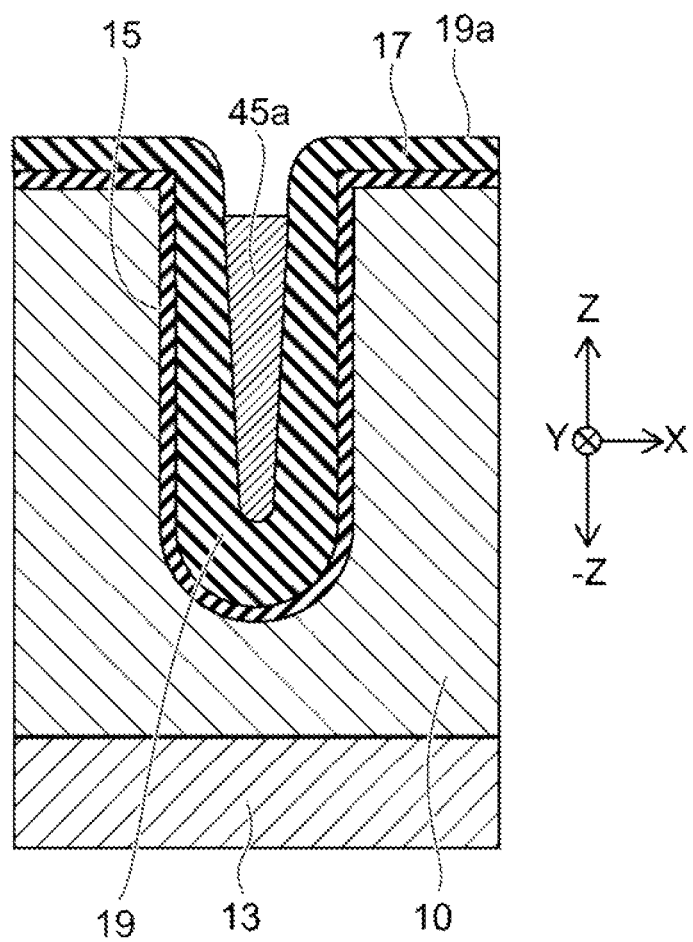

Then, as shown in FIG. 3B, a portion 45a of the conductive layer 45 which becomes a field plate electrode (hereinafter, referred to as a field plate electrode 30) is left in the trench 15, and the conductive layer 45 formed on an upper surface 19a of the second film 19 is etched back.

Next, as shown in FIG. 4A to FIG. 5A, the second film 19 and the first film 17 are etched back. For example, using an etchant which exhibits selectivity to polysilicon, the first film 17 and the second film 19 are etched without etching the field plate electrode 30. An etchant having an etching rate for the first film 17 that is faster than an etching rate of the second film 19 may be used.

For example, when the first film 17 is formed of a silicon oxide film and the second film 19 is formed of a BPSG film, a buffered hydrofluoric acid (BHF) is used as an etchant. By using BHF, an etching rate of the first film 17 is higher than an etching rate of the second film 19.

Figure 4A:
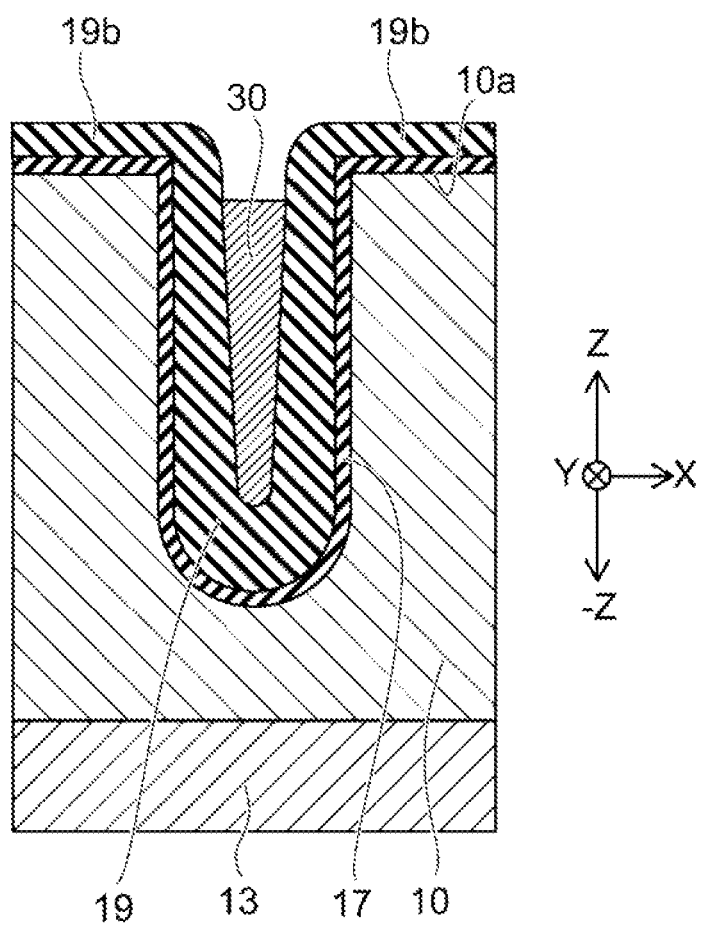
Figure 4B:
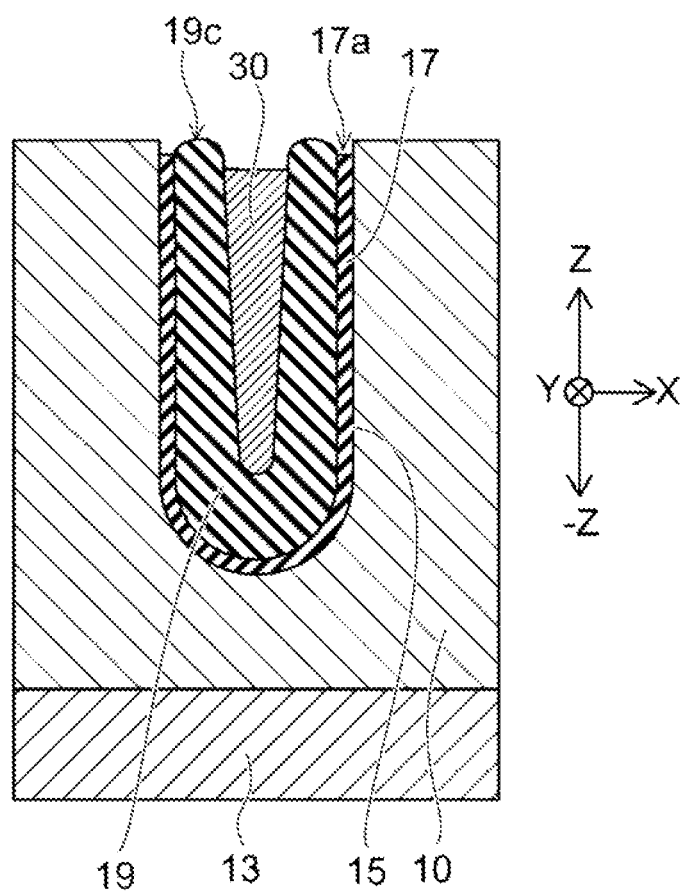

By setting an etching rate of the first film 17 higher than an etching rate of the second film 19, after a portion 19a of the second film 19 formed on the upper surface 10a of the drift layer 10 is etched, etching of the first film 17 progresses faster. As a result, as shown in FIG. 4B, a position of an upper surface 17a of the first film 17 is set deeper than an upper surface 19c of the second film 19 in the −Z direction.

Figure 5A:
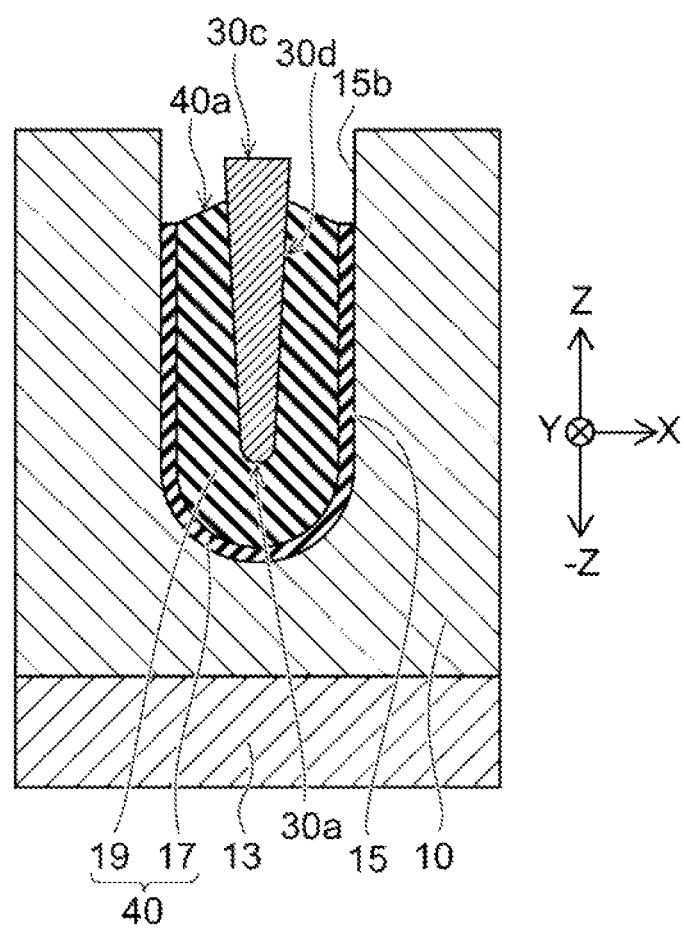

Then, as etching further progresses, as shown in FIG. 5A, the position of the upper surface 17a (shown in FIG. 4B) of the first film 17 and the position of the upper surface 19c (shown in FIG. 4B) of the second film 19 are set deeper than the distal end 30c of the field plate electrode 30 in the −Z direction. Due to such etching, the field plate insulation film 40 is formed. In the field plate insulation film 40, the first film 17 is etched deeply so that an upper surface 40a of the field plate insulation film 40 is inclined in the −Z direction directed toward the drift layer 10 from the field plate electrode 30.

In this manner, in the field plate insulation film 40, a film thickness between the proximal end 30a of the field plate electrode 30 and the drift layer 10 in the −Z direction becomes greater than a film thickness between a side surface 30d and the drift layer 10 along the Z direction. Further, a film thickness of the field plate insulation film 40 between the side surface 30d and the drift layer 10 gradually decreases as the film extends in the Z direction.

Figure 5B:
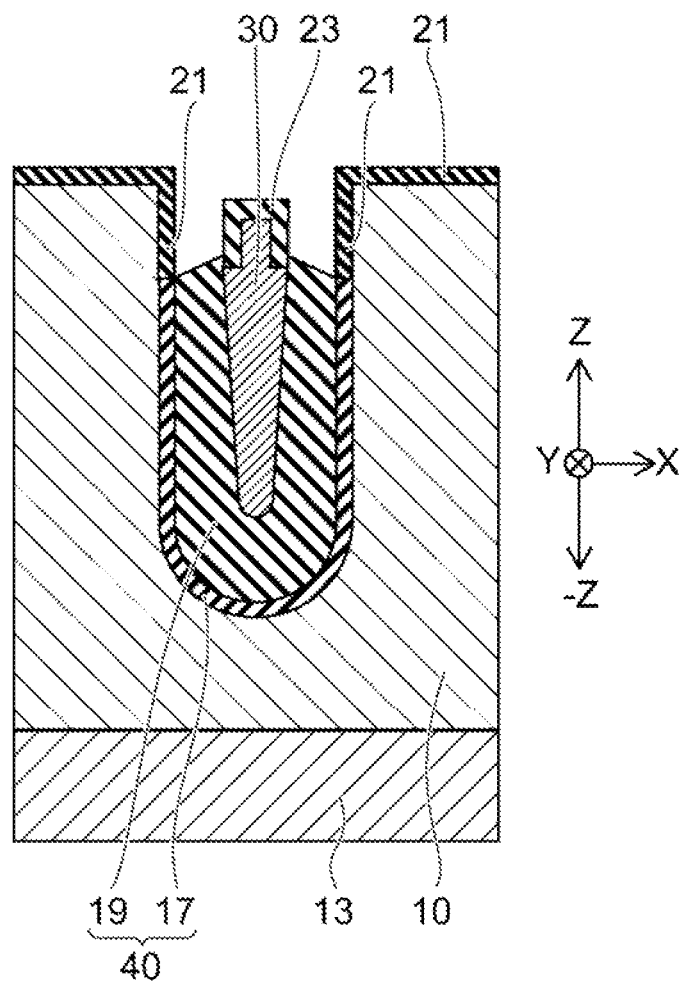

Next, as shown in FIG. 5B, the gate insulation films 21 are formed on side surfaces 15b of the trench 15, and the insulation film 23 is formed on the distal end portion of the field plate electrode 30 in the Z direction. For example, the drift layer 10 which is exposed at an upper portion of the trench 15 and a portion of the field plate electrode 30 which projects from the field plate insulation film 40 are thermally oxidized thus forming a silicon oxide film on surfaces of such portions.

Figure 6A:
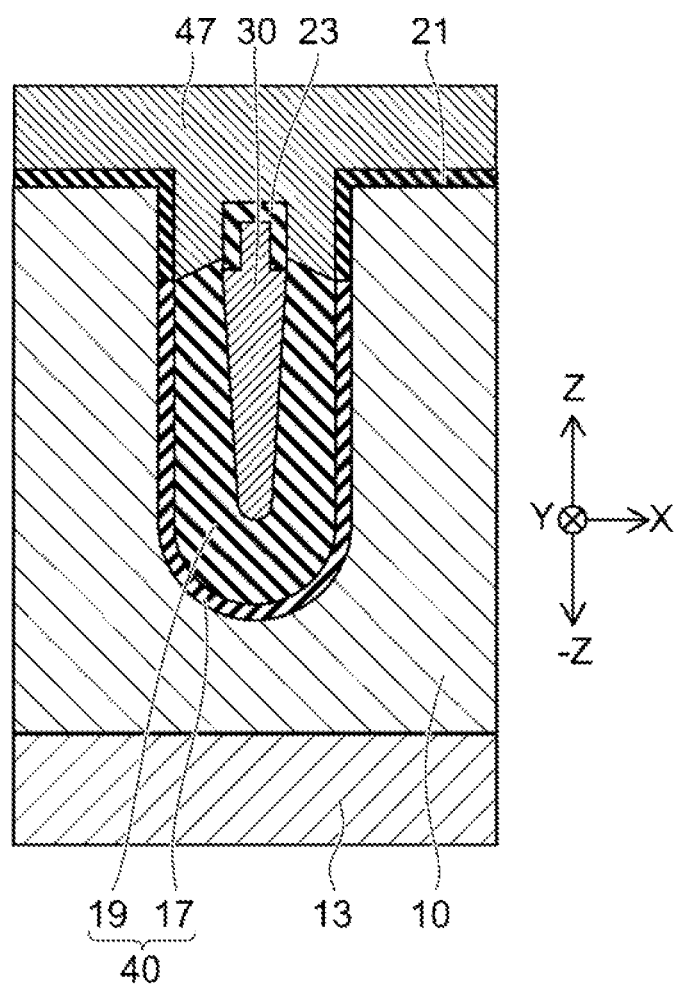

Next, as shown in FIG. 6A, a conductive layer 47 is formed on the drift layer 10 in such a manner that a space formed in the upper portion of the trench 15 is filled with the conductive layer 47. The conductive layer 47 is a polysilicon layer having conductivity and is formed by a CVD method.

Figure 6B:
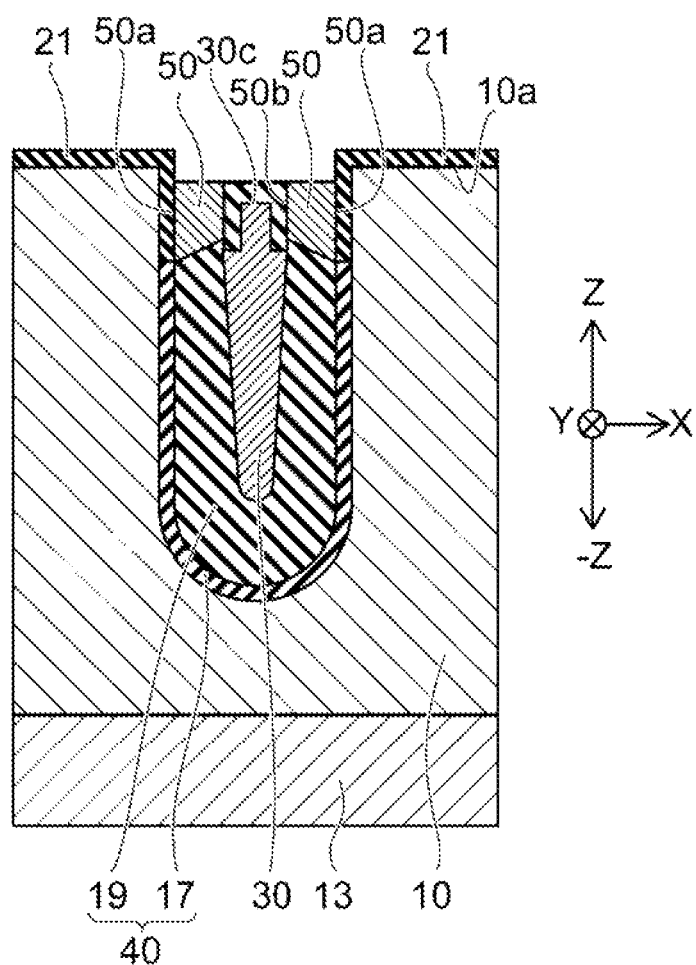

Subsequently, as shown in FIG. 6B, the conductive layer 47 is etched back while leaving the gate electrodes 50 on the field plate insulation film 40. The gate electrodes 50 are formed between the field plate electrode 30 and the drift layer 10.

Figure 7A:
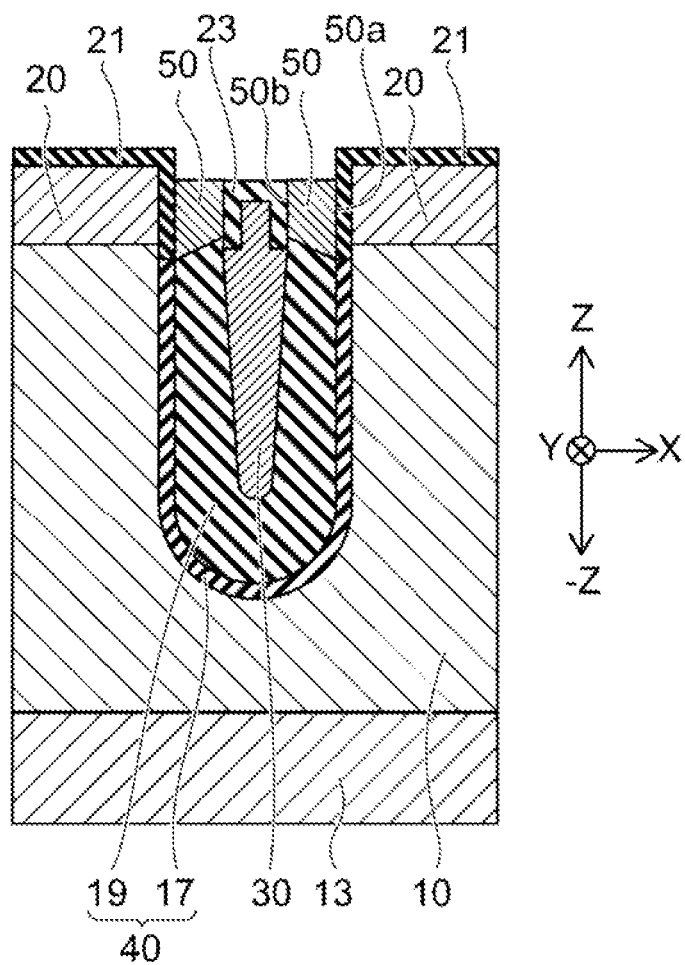

Next, as shown in FIG. 7A, the base layer 20 is formed on the drift layer 10. For example, a p-type impurity is injected into the drift layer 10 through an upper surface 10a of the drift layer 10 by ion implantation, and ions are activated by applying heat treatment to the wafer. The p-type impurity is diffused into the drift layer 10 at a predetermined depth in the heat treatment process. For example, a lower end of the base layer 20 is set at a depth which does not exceed a lower end of the gate electrode 50 in the −Z direction.

Figure 7B:
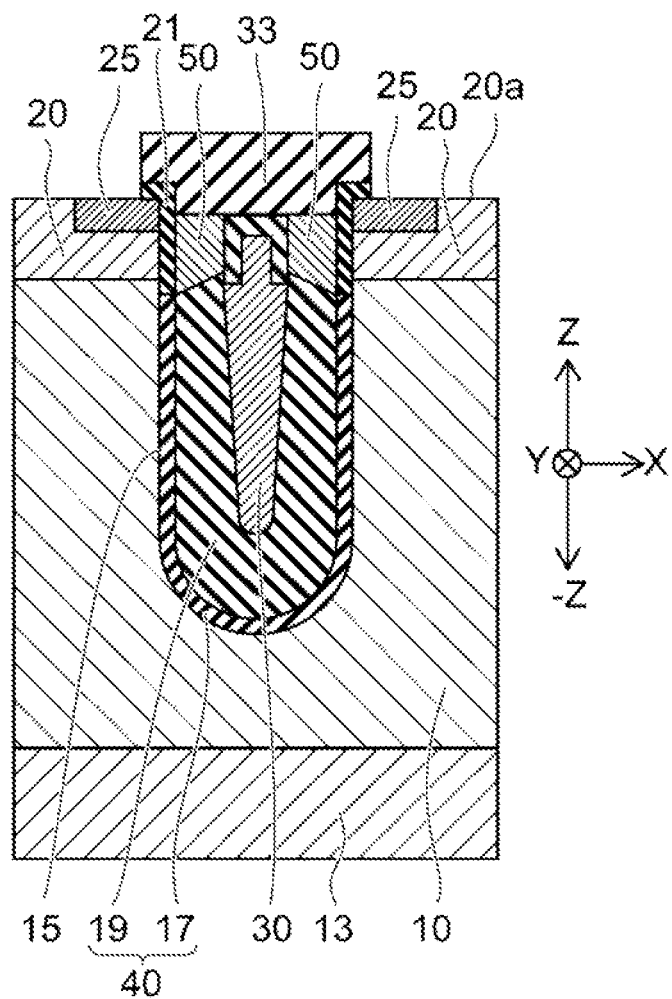

Subsequently, as shown in FIG. 7B, the interlayer insulation film 33 which covers the trench 15 is formed on the gate electrodes 50 and the field plate electrode 30, and the gate insulation film 21 on the base layer 20 is removed. Then, the source layers 25 are formed on the base layer 20. The source layers 25 face the gate electrodes 50 with the gate insulation film 21 interposed therebetween. The source layers 25 are formed such that an n-type impurity is selectively implanted into the base layer 20 by ion implantation through an upper surface 20a of the base layer 20, and ions are activated by applying heat treatment to the wafer.

Lower ends of the source layers 25 are set at a position lower than upper ends of the gate electrodes 50 in the −Z direction. The gate electrodes 50 face the drift layer 10, the base layer 20 and the source layers 25 with the gate insulation films 21 interposed therebetween.

In this embodiment, the upper surface 40a of the field plate insulation film 40 is formed into a shape where the upper surface 40a is inclined in the −Z direction toward the drift layer 10 from the field plate electrode 30. Accordingly, a surface 50a of the gate electrode 50 which faces the base layer 20 with the gate insulation film 21 interposed therebetween becomes greater than a surface 50b of the gate electrode 50 which faces the field plate electrode 30 with the insulation film 23 interposed therebetween.

Figure 8A:
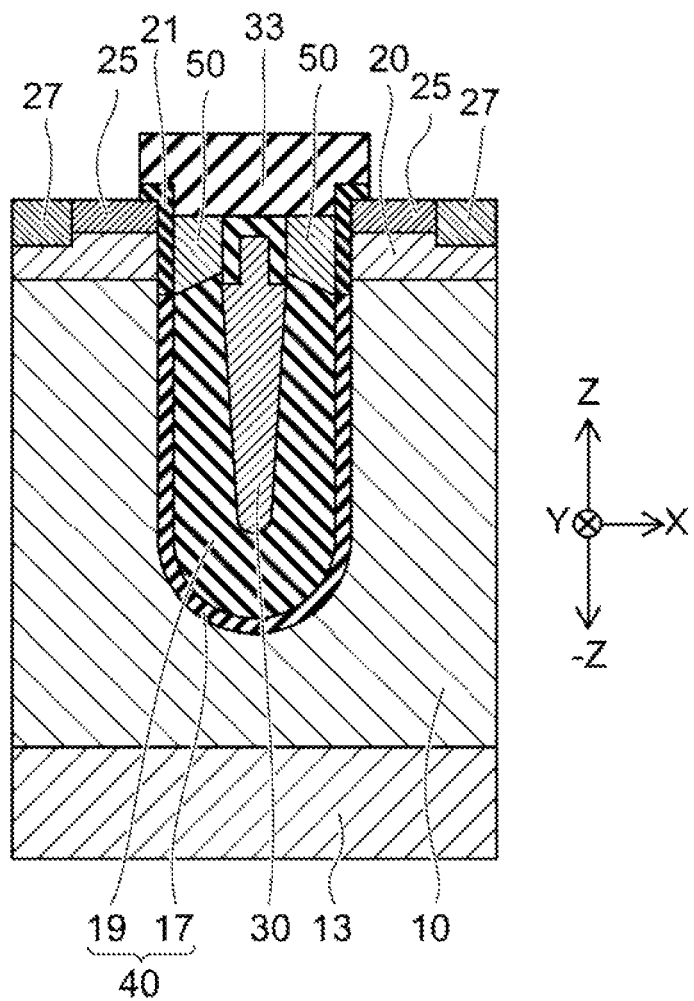

Next, as shown in FIG. 8A, the contact layers 27 are formed on the base layers 20. The contact layers 27 are formed such that a p-type impurity is selectively implanted into the base layer 20 by ion implantation through the upper surface 20a of the base layer 20 (see FIG. 7B). The contact layers 27 are arranged parallel to the source layers 25, and contain a p-type impurity at a higher density than the base layer 20.

Figure 8B:
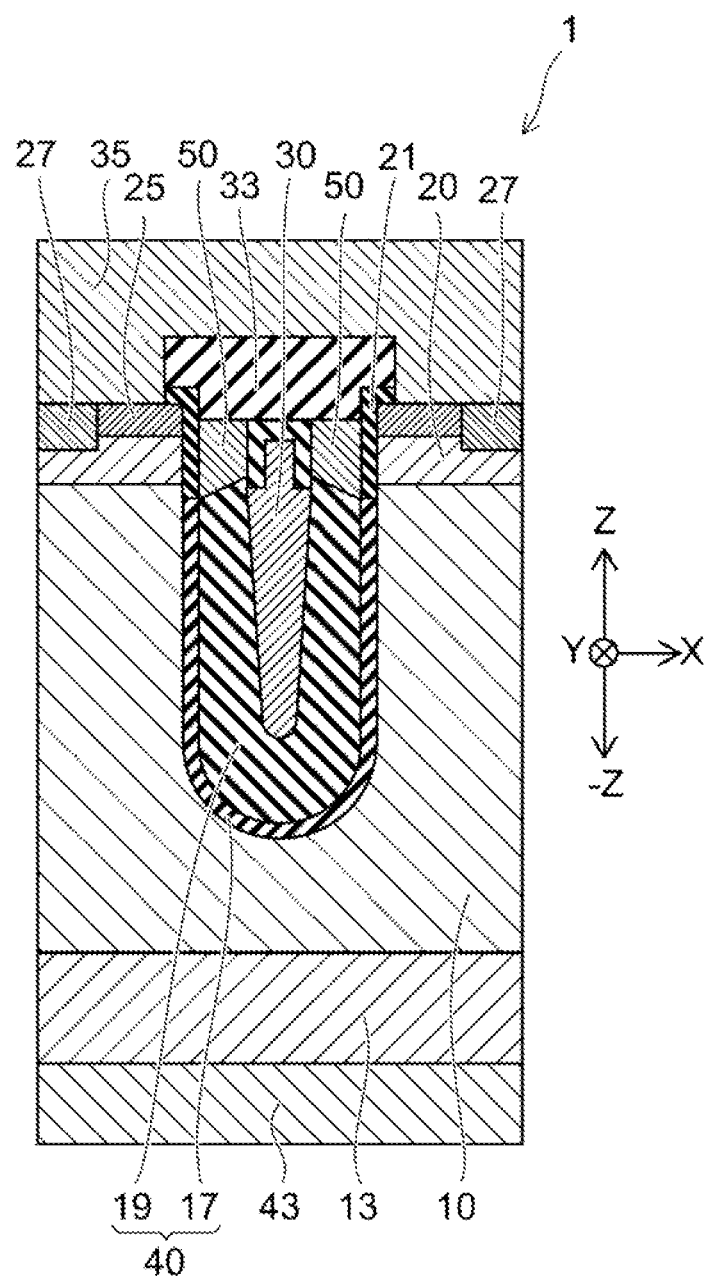

Sequentially, as shown in FIG. 8B, the source electrode 35 is formed such that the source electrode 35 covers the interlayer insulation film 33 and is brought into contact with the source layers 25 and the contact layers 27. Then, the drain electrode 43 is formed on the rear surface side of the drain layer 13 thus completing the semiconductor device 1.

Figure 10:
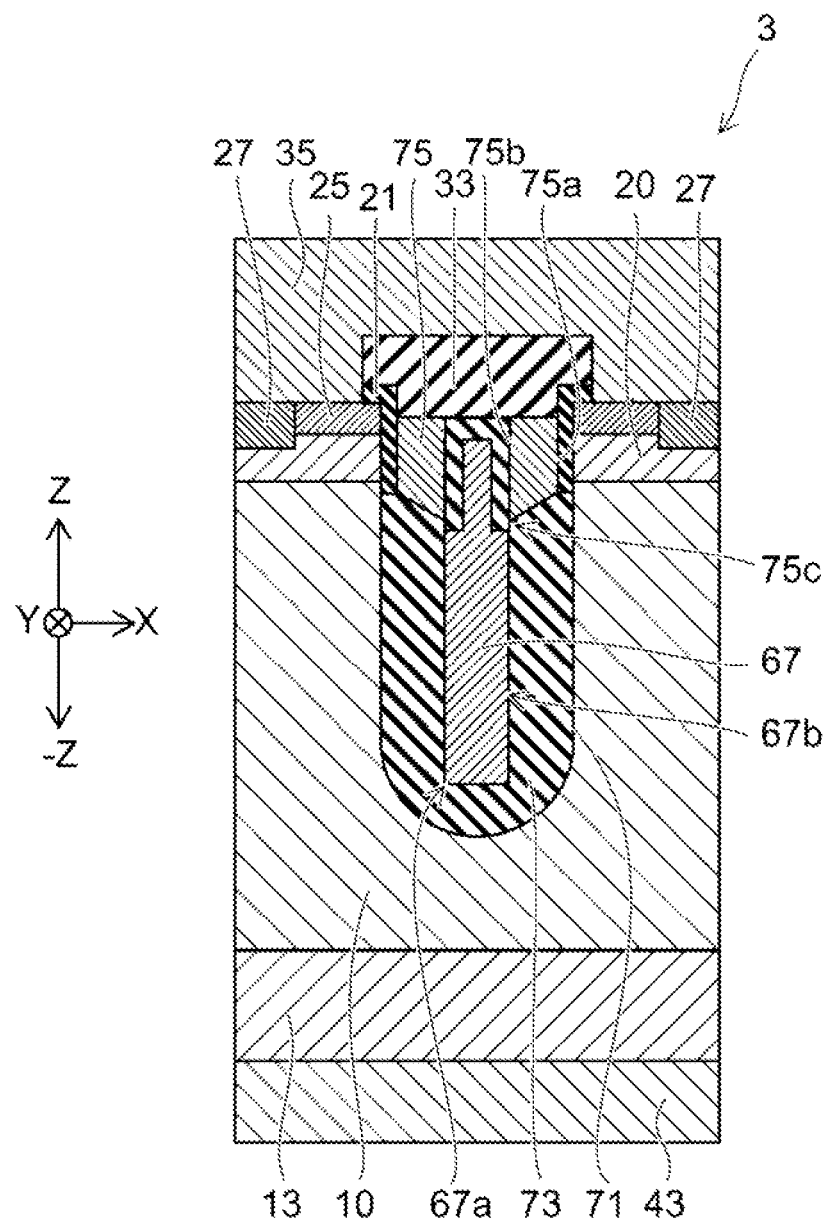
FIG. 10 is a schematic cross-sectional view showing a semiconductor device according to a conventional example.

Next, a semiconductor device 3 according to a conventional example shown in FIG. 10 is explained. FIG. 10 is a schematic cross-sectional view showing the semiconductor device 3 of the comparison example.

The semiconductor device 3 includes an n-type drift layer 10 and a p-type base layer 20 formed on the n-type drift layer 10. N-type source layers 25 and p-type contact layers 27 are formed parallel to each other on the p-type base layer 20. An n-type drain layer 13 is formed on the n-type drift layer 10 in the −Z direction. Further, the semiconductor device 3 includes a trench 71 having a depth at which the trench 71 reaches the drift layer 10 from the source layers 25.

A field plate electrode 67 which extends in the Z direction is formed in the inside of the trench 71. A field plate insulation film 73 is provided between the field plate electrode 67 and the drift layer 10. Gate electrodes 75 which face the base layer 20 with a gate insulation film 21 interposed therebetween are formed on ends of the field plate insulation film 73 in the Z direction.

The field plate insulation film 73 is a silicon oxide film which is formed by thermally oxidizing side surfaces of the trench formed in the drift layer 10, for example. A film thickness of the field plate insulation film 73 between an end 67a of the field plate electrode 67 and the drift layer 10 in the −Z direction is smaller than the film thickness of the field plate insulation film 73 between the side surface 67b and the drift layer 10 extending in the Z direction. Accordingly, a dielectric strength of the field plate insulation film 73 is lowered between the end 67a of the field plate electrode 67 and the drift layer 10.

To increase a dielectric breakdown strength of the field plate insulation film 73, it is necessary to increase a film thickness of the field plate insulation film 73 between the end 67a of the field plate electrode 67 and the drift layer 10. However, along with the increase of the thickness of the field plate insulation film 73 between the end 67a of the field plate electrode 67 and the drift layer 10, the thickness of the field plate insulation film 73 between the side surface 67b of the field plate electrode 67 and the drift layer 10 is also increased. As a result, a stress applied between the field plate insulation film 73 and the drift layer 10 is increased. As such, warping of a wafer is increased.

To the contrary, according to embodiments described herein, at least a portion of the field plate insulation film 40 is formed using a CVD film which exhibits less stress to the drift layer 10 than a thermally oxidized film. Accordingly, the warping of a wafer in the steps of manufacturing of the semiconductor device can be suppressed.

Further, even when the film thickness of the field plate insulation film 40 is increased between the end 30a of the field plate electrode 30 and the drift layer 10 where the electric field concentration is liable to be generated, the thickness of the field plate insulation film 40 between the side surface of the field plate electrode 30 and the drift layer 10 can be made smaller than the thickness of the field plate insulation film 40 between the end 30a of the field plate electrode 30 and the drift layer 10. That is, a width of the trench 15 in the X direction can be narrowed compared to a case where the field plate insulation film is formed using a thermal oxide film. Accordingly, the integration density of trench gates can be enhanced by narrowing a pitch of the trench. As a result, a width of a channel can be increased so that the ON resistance of the semiconductor device can be decreased.

Further, as shown in FIG. 10, in the semiconductor device 3, upper surfaces of the field plate insulation film 73 in the Z direction are inclined in the −Z direction toward the field plate electrode 67 from the base layer 20. Accordingly, a surface of the gate electrode 75 which faces the field plate electrode 67 is larger than a surface of the gate electrode 75 which faces the base layer 20. To the contrary, according to embodiments described herein, the surface of the gate electrode 50 which faces the field plate electrode 30 is smaller than the surface of the gate electrode 50 which faces the base layer 20. Accordingly, a parasitic capacitance between the field plate electrode 30 and the gate electrode 50, that is, a gate-source capacitance can be decreased.

Further, in the semiconductor device 3 shown in FIG. 10, a lower end of the gate electrode 75 on a field plate electrode side is formed into a shape having an acute angle. Accordingly, an electric field between the gate electrode 75 and the field plate electrode 67 is concentrated on the lower end of the gate electrode 75 so that a dielectric breakdown strength between the gate electrode 75 and the field plate electrode 67 is lowered. To the contrary, according to embodiments described herein, the upper surfaces of the field plate insulation film 40 are inclined in the −Z direction toward the base layer 20 from the field plate electrode 30. Accordingly, a lower end of the gate electrode 50 on a field plate electrode 30 side is formed into a shape having an obtuse angle. Accordingly, the electric field concentration at the lower end of the gate electrode 50 is attenuated so that a dielectric strength between the gate electrode 50 and the field plate electrode 30 can be increased. That is, the dielectric strength between the gate and the source can be enhanced.

In this manner, according to the semiconductor device 1 according to embodiments described herein, the occurrence of warping of the wafer in the steps of manufacturing of the semiconductor device can be suppressed. Further, by enhancing the dielectric strength between the field plate electrode 30 and the drift layer 10, the ON resistance of the semiconductor device can be lowered. Still further, by reducing a parasitic capacitance between the source and the gate, the dielectric breakdown strength between the source and the gate can be decreased.

(Second Embodiment)

Figure 9:
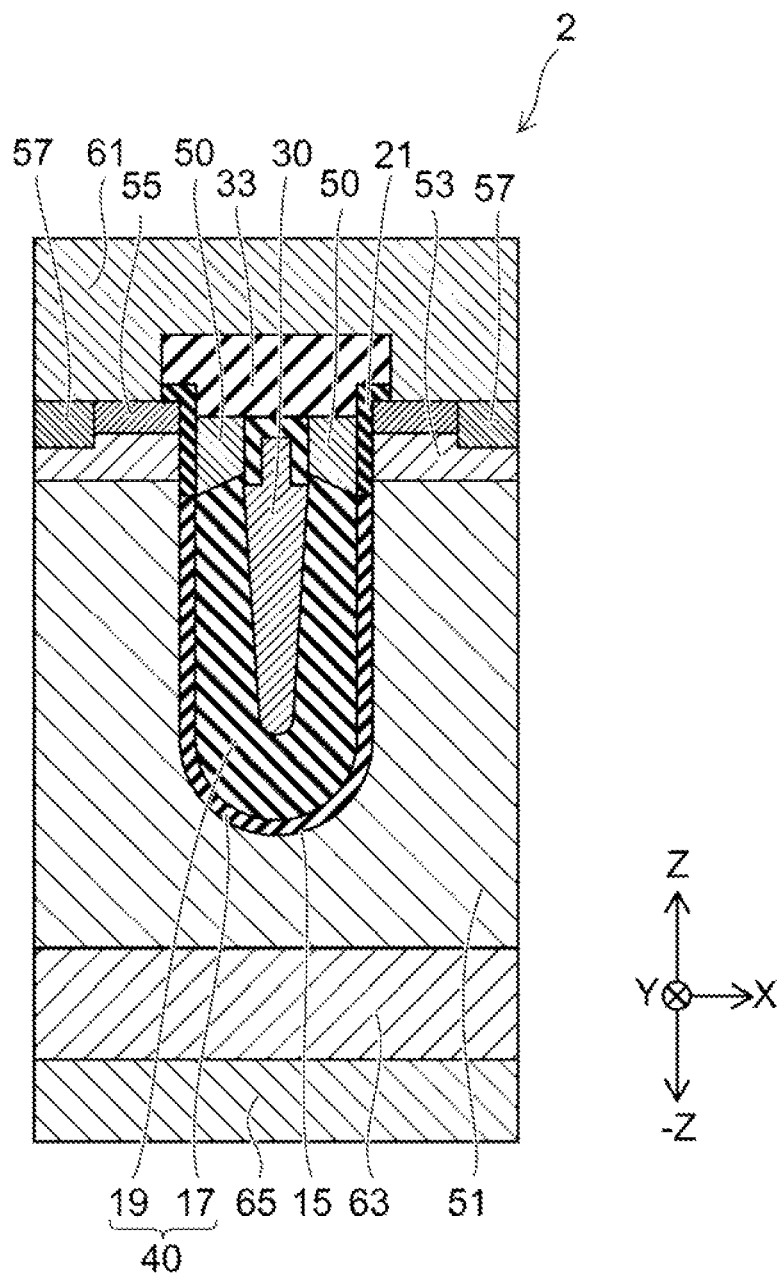
FIG. 9 is a schematic cross-sectional view showing a semiconductor device according to a second embodiment.

FIG. 9 is a schematic cross-sectional view showing a semiconductor device 2 according to the second embodiment. The semiconductor device 2 is a so-called IGBT (Insulated Gate Bipolar Transistor), for example.

The semiconductor device 2 includes an n-type base layer (first semiconductor layer) and a p-type base layer 53 (second semiconductor layer), for example. The p-type base layer 53 is formed on the n-type base layer 51.

N-type emitter layers 55 (third semiconductor layers) and p-type contact layers 57 are formed parallel to each other on the p-type base layer 53. On the other hand, a p-type collector layer 63 (fourth semiconductor layer) is formed on the n-type base layer 51 in the −Z direction. The semiconductor device 2 includes a trench 15 having a depth at which the trench 15 reaches the n-type base layer 51 from the n-type emitter layer 55.

A field plate electrode 30 is formed in the inside of the trench 15. A field plate insulation film 40 is formed between the field plate electrode 30 and the n-type base layer 51. Gate electrodes 50 which face the p-type base layers 53 with a gate insulation film 21 interposed therebetween are formed on the field plate insulation film 40. Further, an emitter electrode 61 which covers the trench 15 by way of an interlayer insulation film 33 is formed over the gate electrodes 50 and the field plate electrode 30. The emitter electrode 61 is brought into contact with the n-type emitter layers 55 and the p-type contact layers 57. On the other hand, a collector electrode 65 is formed on a rear surface side of a p-type collector layer 63.

The semiconductor device 2 can be manufactured by the same manufacturing method used for manufacturing the semiconductor device 1 of the first embodiment. Accordingly, the warping of a wafer in the steps of manufacturing of the IGBT can be suppressed and hence, a dielectric strength between the emitter and the collector can be enhanced. Further, the ON resistance of the semiconductor device can be decreased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:

1. A semiconductor device comprising:
    a first semiconductor layer of a first conductivity type;
    a second semiconductor layer of a second conductivity type formed on the first semiconductor layer;
    a first electrode extending along a first direction into the first semiconductor layer, the first electrode being surrounded by the first semiconductor layer except at a first end thereof;
    a first insulation film between the first semiconductor layer and the first electrode, the first insulation film including a first layer contacting the first semiconductor layer and a second layer containing at least one of phosphorus (P) and boron (B) between the first electrode and the first layer, the first insulation film having an increasing thickness along the first direction from the second semiconductor layer to a second end of the first electrode;
    a second electrode contacting a surface of the second layer of the first insulation film, the second electrode being adjacent to the second semiconductor layer in a second direction crossing the first direction;
    a second insulation film between the second electrode and the second semiconductor layer and having a thickness that is less than the second thickness of the first insulation film; and
    a third insulation film between the first electrode and the second electrode.

2. The semiconductor device according to claim 1, wherein a thickness of the first electrode in the second direction decreases along the first direction between the first end and the second end thereof.

3. The semiconductor device according to claim 2, wherein the second end of the first electrode is a curved surface.

4. The semiconductor device according to claim 1, wherein the second electrode is formed between the first end of the first electrode and the second semiconductor layer, and
    a surface area of the second electrode which faces the second semiconductor layer adjacent the second insulation film is greater than a surface area of the second electrode which faces the first electrode adjacent to the third insulation film.

5. A semiconductor device comprising:
a first semiconductor layer of a first conductivity type;
a second semiconductor layer of a second conductivity type formed on the first semiconductor layer;
a first electrode disposed in a trench formed in the first semiconductor layer, the first electrode extending in a first direction toward the second semiconductor layer through a portion of the first semiconductor layer and surrounded by the first semiconductor layer except at a first end thereof; and
a first insulation film formed between the first semiconductor layer and the first electrode, the first insulation film including a first layer in contact with the first semiconductor layer and a second layer containing at least one of phosphorus (P) and boron (B) contained within the trench between the first electrode and the first layer, wherein a film thickness of the first insulation film between a second end of the first electrode and the first semiconductor layer is greater than at thickness between a side surface of the first electrode and the first semiconductor layer and the film thickness of the first insulation film between the side surface of the first electrode and the first semiconductor layer increases along the first direction toward the second end of the first electrode;
a second electrode which is formed on an end of the first insulation film and faces the second semiconductor layer;
a second insulation film which is formed between the second electrode and the second semiconductor layer and has a thickness less than the film thickness of the first insulation film; and
a third insulation film formed between the first electrode and the second electrode.

6. The semiconductor device according to claim 5, wherein the second electrode is formed between the first end of the first electrode and the second semiconductor layer, and
a surface area of the second electrode which faces the second semiconductor layer adjacent the second insulation film is greater than a surface area of the second electrode which faces the first electrode adjacent the third insulation film.

7. The semiconductor device according to claim 5, wherein the first layer is an oxide film formed by thermally oxidizing the first semiconductor layer.

8. The semiconductor device according to claim 5, wherein the first layer is an oxide film or a nitride film.

9. The semiconductor device according to claim 8, wherein the second electrode is formed between the first end of the first electrode and the second semiconductor layer, and
a surface area of the second electrode which faces the second semiconductor layer adjacent the second insulation film is greater than a surface area of the second electrode which faces the first electrode adjacent the third insulation film.

10. A semiconductor device comprising:
a first semiconductor layer of a first conductivity type;
a second semiconductor layer of a second conductivity type formed on the first semiconductor layer;
a first electrode extending toward the second semiconductor layer away from the first semiconductor layer and which is surrounded by the first semiconductor layer except at a first end thereof; and
a first insulation film which is formed between the first semiconductor layer and the first electrode, the first insulation film having a film thickness at a second end of the first electrode that is greater than a thickness of the first insulation film along a side surface thereof as the first insulation film approaches the first end of the first electrode;
a second electrode which is formed on an end of the first insulation film and faces the second semiconductor layer;
a second insulation film which is formed between the second electrode and the second semiconductor layer and has a thickness that is less than the thickness of the first insulation film; and
a third insulation film formed between the first electrode and the second electrode, wherein
the second electrode is formed between the first end of the first electrode and the second semiconductor layer, and
a surface area of the second electrode which faces the second semiconductor layer adjacent the second insulation film is greater than a surface area of the second electrode which faces the first electrode adjacent to the third insulation film.

* * * * *